United States Patent
Weng et al.

(10) Patent No.: US 10,642,395 B2
(45) Date of Patent: May 5, 2020

(54) SHIFT REGISTER AND TOUCH DISPLAY APPARATUS THEREOF

(71) Applicant: HON HAI PRECISION INDUSTRY CO., LTD., New Taipei (TW)

(72) Inventors: Yu-Fu Weng, New Taipei (TW); Chien-Wen Lin, New Taipei (TW); Tzu-Yu Cheng, New Taipei (TW)

(73) Assignee: HON HAI PRECISION INDUSTRY CO., LTD., New Taipei (TW)

( * ) Notice: Subject to any disclaimer, the term of this patent is extended or adjusted under 35 U.S.C. 154(b) by 0 days.

(21) Appl. No.: 16/123,055

(22) Filed: Sep. 6, 2018

(65) Prior Publication Data

US 2020/0012368 A1     Jan. 9, 2020

(30) Foreign Application Priority Data

Jul. 4, 2018   (CN) .......................... 2018 1 0725026

(51) Int. Cl.
   *G06F 3/041*     (2006.01)
   *G11C 19/28*     (2006.01)
   *G09G 3/20*      (2006.01)

(52) U.S. Cl.
   CPC .......... *G06F 3/0412* (2013.01); *G06F 3/0416* (2013.01); *G09G 3/20* (2013.01); *G11C 19/28* (2013.01); *G09G 2310/0286* (2013.01); *G09G 2310/063* (2013.01)

(58) Field of Classification Search
   CPC ....... G11C 19/28; G11C 19/00; G11C 19/184; G11C 27/04; G11C 19/287; G11C 19/285; G11C 8/04; G09G 2310/0286; G09G 3/3677; G09G 2310/0267; G09G 3/3674; G09G 3/3266; G09G 2310/0283; G09G 2310/08; H03K 23/54
   See application file for complete search history.

(56) References Cited

U.S. PATENT DOCUMENTS

| | | | |
|---|---|---|---|
| 8,559,588 B2 * | 10/2013 | Kikuchi ................. | G11C 19/28 377/64 |
| 9,495,922 B2 * | 11/2016 | Hirabayashi ......... | G09G 3/3677 |
| 9,524,686 B2 * | 12/2016 | Zhang ................... | G09G 3/3648 |
| 9,690,419 B2 * | 6/2017 | Zhang .................... | G11C 19/28 |
| 9,766,741 B2 * | 9/2017 | Zhao ...................... | G11C 19/287 |
| 9,791,968 B2 * | 10/2017 | Hu ............................ | G09G 3/20 |
| 9,953,721 B2 * | 4/2018 | Ma ........................... | G09G 3/20 |
| 10,007,439 B2 * | 6/2018 | Kim ........................ | G11C 5/025 |

(Continued)

*Primary Examiner* — Michael J Jansen, II
(74) *Attorney, Agent, or Firm* — ScienBiziP, P.C.

(57) ABSTRACT

A shift register driving a touch display device generates shifted pulse signals shifted by a specified phase. The shift register includes unit circuits connected in multiple stages. Each unit circuit includes an output terminal, an input transistor, an output transistor, and a pull-up transistor. The input transistor is controlled by a first control signal and outputs a high-level voltage to a first node based on the value of a trigger signal. The output transistor outputs the shifted pulse signal, which is synchronous with a clock control signal, based on the value of the high-level voltage of the first node. A blank period is inserted between the Nth unit circuit and the (N+1)th unit circuit. After the blank period, the pull-up transistor clamps the voltage of the output terminal of the (N+1)th unit circuit at a high-level voltage.

9 Claims, 4 Drawing Sheets

(56) References Cited

U.S. PATENT DOCUMENTS

| | | | | |
|---|---|---|---|---|
| 10,031,614 B2* | 7/2018 | Sung | ............ | G09G 3/3688 |
| 10,088,944 B2* | 10/2018 | Abe | ............ | G06F 3/0416 |
| 10,095,355 B2* | 10/2018 | Yang | ............ | G06F 3/0418 |
| 10,146,362 B2* | 12/2018 | Xu | ............ | G06F 3/0412 |
| 10,210,836 B2* | 2/2019 | Park | ............ | H01L 29/78696 |
| 10,276,122 B2* | 4/2019 | Yamamoto | ............ | G11C 19/00 |
| 10,332,434 B2* | 6/2019 | Sang | ............ | G06F 3/0412 |
| 10,488,967 B2* | 11/2019 | Sato | ............ | G06F 3/0416 |
| 2012/0032615 A1* | 2/2012 | Kikuchi | ............ | G11C 19/28 |
| | | | | 315/320 |
| 2012/0082287 A1* | 4/2012 | Moriwaki | ............ | G11C 19/28 |
| | | | | 377/64 |
| 2013/0241814 A1* | 9/2013 | Hirabayashi | ............ | G09G 3/3677 |
| | | | | 345/100 |
| 2016/0049126 A1* | 2/2016 | Zhang | ............ | G09G 3/3648 |
| | | | | 345/173 |
| 2016/0266699 A1* | 9/2016 | Zhao | ............ | G11C 19/287 |
| 2017/0003804 A1* | 1/2017 | Sung | ............ | G06F 3/0412 |
| 2017/0003807 A1* | 1/2017 | Abe | ............ | G06F 3/0416 |
| 2017/0010731 A1* | 1/2017 | Zhang | ............ | G11C 19/28 |
| 2017/0083155 A1* | 3/2017 | Yang | ............ | G06F 3/0418 |
| 2017/0102814 A1* | 4/2017 | Xu | ............ | G06F 3/0412 |
| 2017/0178749 A1* | 6/2017 | Ma | ............ | G09G 3/20 |
| 2017/0185297 A1* | 6/2017 | Kim | ............ | G11C 5/025 |
| 2017/0193888 A1* | 7/2017 | Moon | ............ | G09G 3/20 |
| 2017/0221417 A1* | 8/2017 | Jung | ............ | G09G 3/3258 |
| 2017/0269769 A1* | 9/2017 | Hu | ............ | G09G 3/20 |
| 2017/0323612 A1* | 11/2017 | Yamamoto | ............ | G11C 19/00 |
| 2018/0122323 A1* | 5/2018 | Park | ............ | H01L 29/7869 |
| 2018/0181244 A1* | 6/2018 | Sato | ............ | G09G 3/3266 |
| 2018/0190364 A1* | 7/2018 | Gu | ............ | G11C 19/184 |
| 2018/0366047 A1* | 12/2018 | Sang | ............ | G11C 19/287 |
| 2019/0012973 A1* | 1/2019 | Wang | ............ | G11C 19/28 |
| 2019/0129562 A1* | 5/2019 | Li | ............ | G06F 3/0416 |

* cited by examiner

SHIFT REGISTER AND TOUCH DISPLAY APPARATUS THEREOF

FIELD

The present disclosure relates to touch displays driven by shift register.

BACKGROUND

Touch display apparatuses can operate under a touch period and a display period. The touch display apparatus includes a plurality of scan lines and a plurality of data lines. The scan lines are perpendicular to the data lines to define a plurality of pixel units. The touch display apparatus further includes a gate driver for driving the scan lines, a source driver for driving the data lines, and a time controller for controlling the gate driver and the source driver. The gate driver includes a shift register. The shift register includes a plurality of cascade-connected unit circuits. Each unit circuit receives a clock control signal, a set signal, and a reset signal, and outputs a pulse signal as a scanning signal to one of the scan lines. Each unit circuit includes a plurality of transistors, a driving transistor, and at least one capacitor, in which the at least one capacitor is electrically coupled between a drain electrode and a source electrode of the driving transistor. The driving transistor outputs a signal synchronous to the clock signal as the scanning signal when turned on. The touch period is inserted between any two display periods. During the touch period, the unit circuit of the gate driver stops outputting the scanning signal, and the driving transistor remains on. A voltage of a gate electrode of the driving transistor may decrease based on a leakage current and the capacitor, and the voltage for turning on the driving transistor increases. When switching into display period from the touch period, the voltage outputted by the unit circuit is lower than a specified voltage, thus abnormal image is displayed during the touch period. Thus, there is room for improvement in the art.

BRIEF DESCRIPTION OF THE FIGURES

Implementations of the present technology will now be described, by way of example only, with reference to the attached figures.

DETAILED DESCRIPTION

Figure 1:
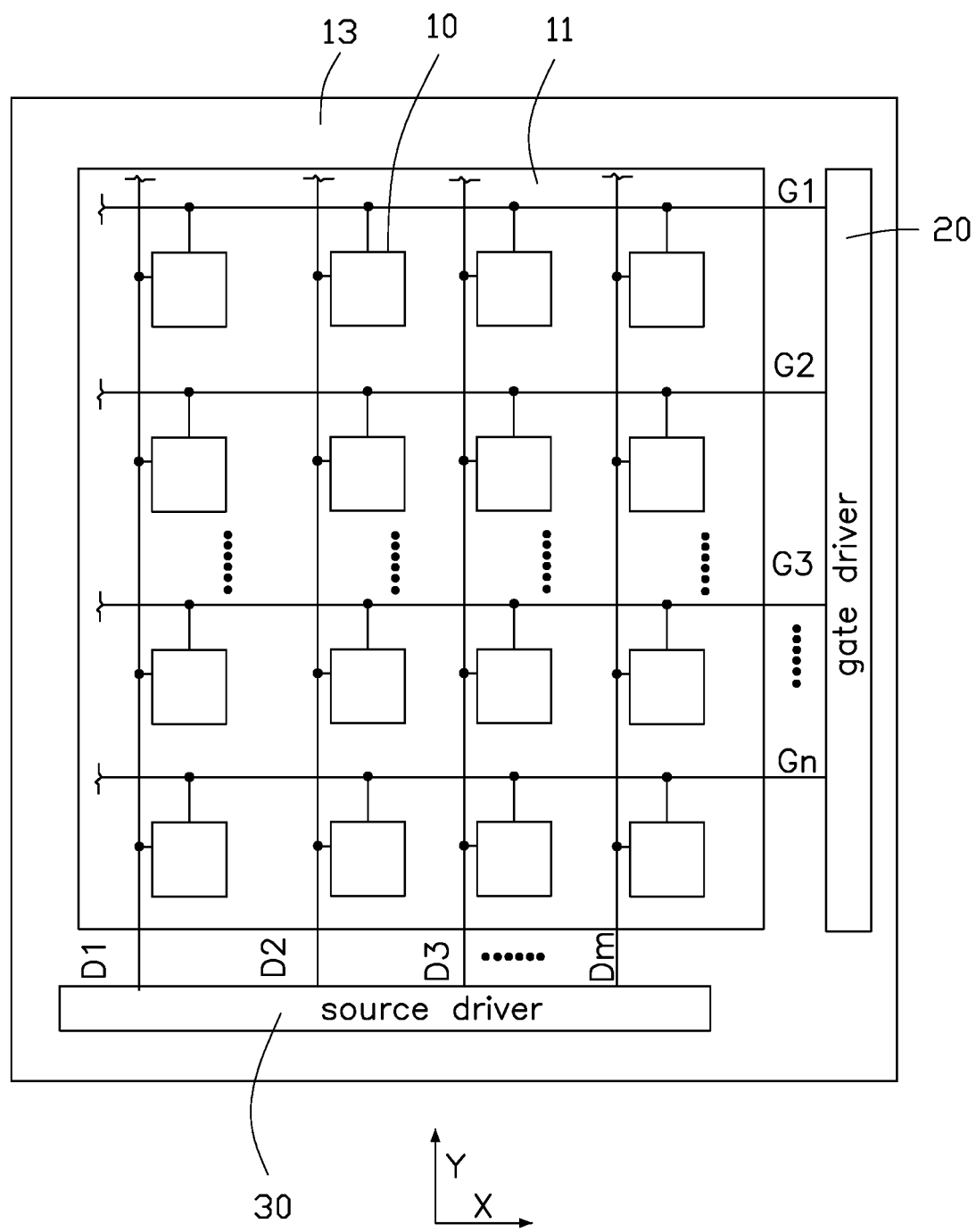
FIG. 1 is a diagrammatic view of an embodiment of a touch display apparatus; the touch display apparatus includes a gate driver with a shift register.

It will be appreciated that for simplicity and clarity of illustration, where appropriate, reference numerals have been repeated among the different figures to indicate corresponding or analogous elements. In addition, numerous specific details are set forth in order to provide a thorough understanding of the embodiments described herein. However, it will be understood by those of ordinary skill in the art that the embodiments described herein can be practiced without these specific details. In other instances, methods, procedures, and components have not been described in detail so as not to obscure the related relevant feature being described. The drawings are not necessarily to scale and the proportions of certain parts may be exaggerated to better illustrate details and features. The description is not to be considered as limiting the scope of the embodiments described herein.

The term "comprising" means "including, but not necessarily limited to"; it specifically indicates open-ended inclusion or membership in a so-described combination, group, series, and the like. The disclosure is illustrated by way of example and not by way of limitation in the figures of the accompanying drawings in which like references indicate similar elements. It should be noted that references to "an" or "one" embodiment in this disclosure are not necessarily to the same embodiment, and such references can mean "at least one." The term "circuit" is defined as an integrated circuit (IC) with a plurality of electric elements, such as capacitors, resistors, amplifiers, and the like.

The present disclosure relates to a shift register. The shift register generates shifted pulse signals shifted by a specified phase. The shift register includes a plurality of cascade-connected unit circuits. Each unit circuit receives a clock control signal. Each unit circuit comprises an output terminal, an input transistor, an output transistor, and a pull-up transistor. The output terminal is electrically coupled to at least one external signal line. The output terminal provides the shifted pulse signal to the at least one external signal line. The shifted pulse signal of the (N+1)th unit circuit outputted to the (N+1)th signal line is shifted by the specified phase by compared to the shifted pulse signal of the Nth unit circuit outputted to the Nth signal line. A blank period is inserted between adjacent shifted pulse signals outputted by two adjacent unit circuits. The input transistor, controlled by a first control signal, outputs a high-level voltage to a first node that activates the current unit circuit based on a trigger signal. The output transistor includes a first control terminal connected to the first node, a first connection terminal that receives the clock control signal, and a second connection terminal connected to the output terminal. The output transistor outputs the shifted pulse signal synchronous to the clock control signal, based on the value of the high-level voltage of the first node. The pull-up transistor includes a second control terminal connected to the output terminal, a third connection terminal connected to the second control terminal, and a fourth connection terminal connected to a high-voltage power source. As the (N+1)th unit circuit outputs the shifted pulse signal after the inserted blank period, the pull-up transistor clamps the voltage of the output terminal of the (N+1)th unit circuit to a high-level voltage.

In an embodiment, during the blank period, the entire unit circuit stops outputting the shifted pulse signal.

In an embodiment, the unit circuit further includes a reset module. The reset module receives a reset signal. The reset module includes a pull-down transistor. The pull-down transistor includes a third control terminal that receives the reset signal, a fifth connection terminal connected to the output terminal, and a sixth connection terminal connected to a low voltage power source. The pull-down transistor outputs a low-level or ground voltage to the output terminal that resets the current unit circuit based on the value of the reset signal.

In an embodiment, the reset module further receives a second control signal. The reset module further includes a first transistor. The first transistor includes a fourth control terminal that receives the second control signal, a seventh connection terminal connected to the first node, and an eighth connection terminal connected to the low-voltage power source. The first transistor outputs the low-level or ground voltage to the first node based on the value of the second control signal.

In an embodiment, the clock control signal, the first control signal, and the second control signal originate from three adjacent clock lines respectively. The first control signal, the clock control signal, and the second control signal are sequentially shifted by the specified phase.

In an embodiment, the reset module further includes a second transistor. The second transistor includes a fifth control terminal that receives the reset signal, a ninth connection terminal connected to the first node, and a tenth connection terminal connected to the low-voltage power source. The second transistor outputs the low-level voltage to the first node based on the value of the reset signal.

A touch display includes a display region and a non-display region surrounding the display region. The non-display region includes at least one gate driver. The at least one gate driver includes at least one shift register. The shift register generates shifted pulse signals shifted by a specified phase. The shift register includes unit circuits connected in multiple stages. Each unit circuit receives a clock control signal. Each unit circuit comprises an output terminal, an input transistor, an output transistor, and a pull-up transistor. The output terminal is electrically coupled to at least one external signal lines, and provides the shifted pulse signal to the connected signal line. The shifted pulse signal of the (N+1)th unit circuit outputted to the (N+1)th signal line is shifted by the specified phase, compared to the shifted pulse signal of the Nth unit circuit outputted to the Nth signal line. A blank period is inserted between two adjacent shifted pulse signals outputted by two adjacent unit circuits. The input transistor, controlled by a first control signal, outputs a high-level voltage to a first node that activates the current unit circuit based on a trigger signal. The output transistor includes a first control terminal connected to the first node, a first connection terminal that receives the clock control signal, and a second connection terminal connected to the output terminal. The output transistor outputs the shifted pulse signal synchronous to the clock control signal, based on the value of the high-level voltage of the first node. The pull-up transistor includes a second control terminal connected to the output terminal, a third connection terminal connected to the second control terminal, and a fourth connection terminal connected to a high voltage power source. After the blank period inserted between the Nth unit circuit and the (N+1)th unit circuit the (N+1)th unit circuit outputs the shifted pulse signal, the pull-up transistor clamps the voltage of the output terminal of the (N+1)th unit circuit at a high-level voltage.

In an embodiment, the touch display apparatus operates under a touch period and a display period. The display period includes sub-display periods. The touch period includes sub-touch periods. Each sub-touch period is inserted between two adjacent sub-display periods. The blank period is the sub-touch period.

FIG. 1 shows an embodiment of the touch display apparatus 1. The touch display apparatus 1 includes a display region 11 and a non-display region 13 surrounding the display region 11. The display region 11 includes scan lines S1-Sn and data lines D1-Dm. In one embodiment, n and m are positive integers larger than 2. The scan lines S1-Sn run parallel with each other along a first direction X, and the data lines D1-Dm run parallel with each other along a second direction Y, in which the second direction Y is perpendicular to the first direction X. The scan lines S1-Sn and the data lines D1-Dm are arranged in a grid that defines pixel units 10 at each line crossing. In one embodiment, the scan lines S1-Sn can intersect D1-Dm at an angle in a touch display device. The non-display region 13 includes a gate driver 20 and a source driver 30. The gate driver 20 is electrically coupled to the scan lines S1-Sn for driving the scan lines S1-Sn. The source driver is electrically coupled to the data lines D1-Dm for outputting data signals to the data lines. The non-display region can further include a time controller. The time controller provides controls signals and at least one clock control signal to the gate driver 20 and the source driver 30. In one embodiment, the time controller provides clock control signals through the clock control lines VCK1-VCK4 to the gate driver 20. The clock control signals outputted from the clock control lines VCK1-VCK4 are pulse signals. The pulse signals of the clock control signals outputted from the clock control lines VCK1-VCK4 are sequentially shifted by a specified phase. The various control signals may include a vertical synchronization (Vsync) signal, a horizontal synchronization (Hsync) signal, and a data enable (DE) signal, but is not limited thereto. Each pixel unit 10 is electrically coupled to the gate driver 20 through one of the scan lines S1-Sn, and is electrically coupled to the source driver 30 through one of the data lines D1-Dm.

Figure 2:
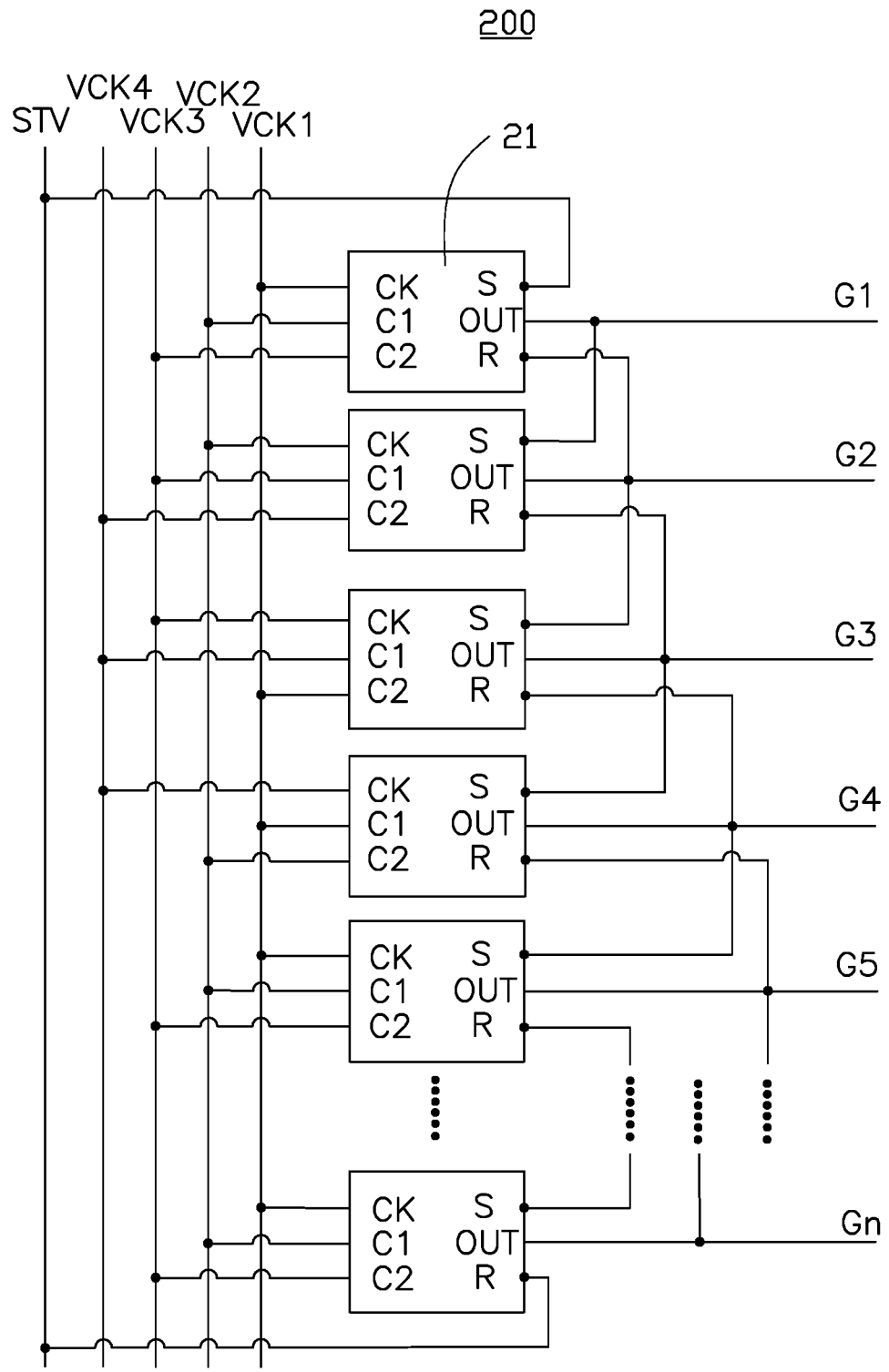
FIG. 2 is a diagrammatic view of the gate driver of the touch display apparatus of FIG. 1, the shift register includes a plurality of unit circuits.
Figure 3:
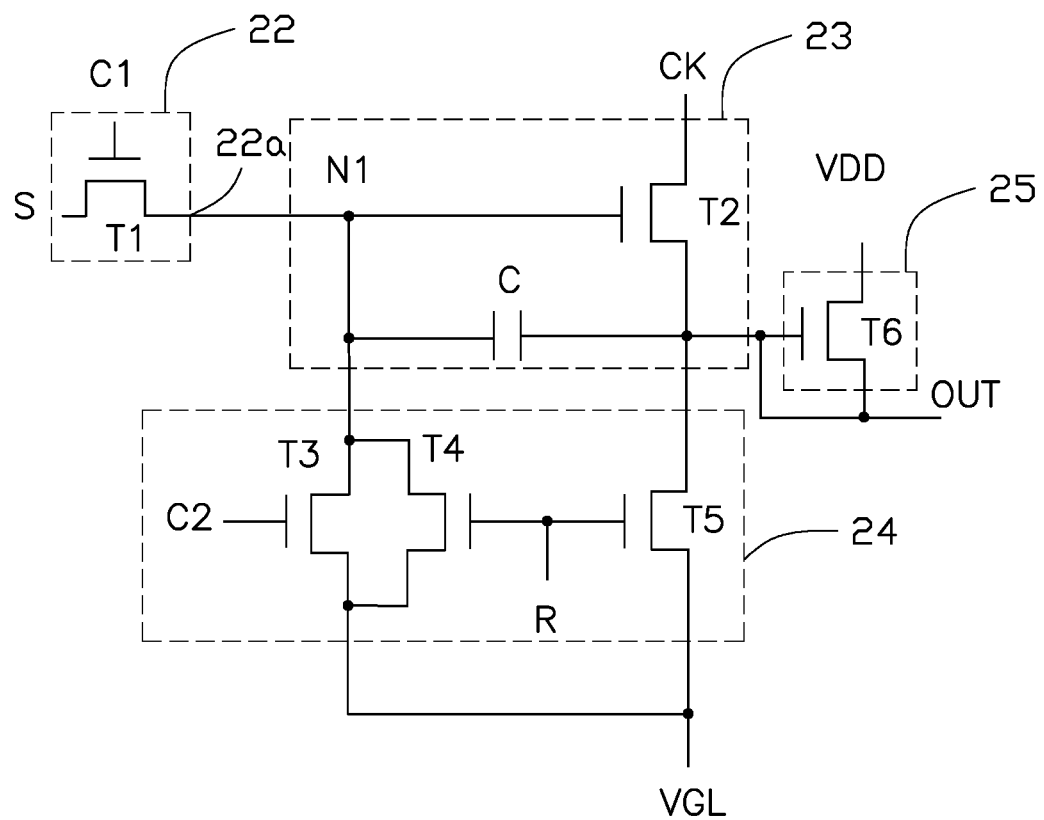
FIG. 3 is a circuit diagram view of a unit circuit of FIG. 2.

FIGS. 2 and 3 show the gate driver 20 and a shift register 200. The gate driver 20 includes at least one shift register 200. The shift register 200 generates shifted pulse signals shifted by a specified phase. The shift register 200 includes unit circuits 21 connected in multiple stages. Each unit circuit 21 is electrically coupled to one scan line of the scan lines S1-Sn and provides the scanning signals to the scan lines S1-Sn. The unit circuit 21 is electrically coupled to three of the clock control lines VCK1-VCK4 and receives a start pulse signal STV. Each unit circuit 21 has the same electrical structure and includes the same terminals.

Each unit circuit 21 includes a clock control terminal CK, a first control terminal C1, and a second control terminal C2. Each unit circuit 21 is electrically coupled to three of the clock control lines VCK1-VCK4. The signals outputted by the clock control input terminal CK, the first control terminal C1, and the second control terminal C2 are sequentially shifted by the specified phase. The clock control terminal of the first unit circuit 21 is electrically coupled to the clock control line VCK1, the first control terminal of the first unit circuit 21 is electrically coupled to the clock control line VCK2, and the second control terminal of the first unit circuit 21 is electrically coupled to the clock control line VCK3. The clock control terminal of the second unit circuit 21 is electrically coupled to the clock control line VCK2, the first control terminal of the second unit circuit 21 is electrically coupled to the clock control line VCK3, and the second control terminal of the second unit circuit 21 is electrically coupled to the clock control line VCK4. The clock control terminal of the third unit circuit 21 is electrically coupled to the clock control line VCK3, the first control terminal of the third unit circuit 21 is electrically coupled to the clock control line VCK4, and the second control terminal of the third unit circuit 21 is electrically coupled to the clock control line VCK1. The clock control terminal of the fourth unit circuit 21 is electrically coupled to the clock control line VCK4, the first control terminal of the fourth unit circuit 21 is electrically coupled to the clock control line VCK1, and the second control terminal of the fourth unit circuit 21 is electrically coupled to the clock control line VCK2.

Each unit circuit 21 further includes a set terminal S, a reset terminal R, and an output terminal OUT. Each unit circuit 21 includes a flip-flop circuit and controls the output terminal OUT based on signals outputted from the set terminal S and the reset terminal R. In detail, when the signal of the set terminal S is effective (such as a high-level voltage) and the signal of the reset terminal R is ineffective (such as a low-level voltage), the output terminal OUT of the unit circuit 21 outputs the high-level voltage. When the signal of the set terminal S is ineffective and the signal of the reset terminal R is effective, the output terminal OUT of the unit circuit 21 outputs the low-level voltage. The signal of the clock control input terminal CK controls a pulse width of the signal of the output terminal OUT.

The unit circuit 21 includes an input module 22 with the set terminal S, an output module 23 with the clock control terminal CK and the output terminal OUT, a reset module with the reset terminal R, and a remaining module 25.

The output module 23 controls the output terminal OUT to output the shifted pulse signal synchronous to the clock signal of the clock control input terminal CK, based on the received signals of the set terminal S and the reset terminal R. The output module 23 includes an output transistor T2 and a storage capacitor C. A control terminal of the output transistor T2 is electrically coupled to a sub-output terminal 22a of the input module 22 at a first node N1. A source electrode of the output transistor T2 is electrically coupled to the clock control input terminal CK, and a drain electrode of the output transistor T2 is electrically coupled to the output terminal OUT. Terminals of the storage capacitor C are connected to the first node N1 and the output terminal OUT.

The input module 22 includes the set terminal S that receives the trigger signal, the sub-output terminal 22a, and the first control terminal C1 that receives the first control signal. The input module 22 further includes an input transistor T1. A control terminal of the input transistor T1 is electrically coupled to the first control terminal C1, a source electrode of the input transistor T1 is electrically coupled to the set terminal S, and a drain electrode of the input transistor T1 is electrically coupled to the sub-output terminal 22a. The input module 22 controls a time of the trigger signal of the set terminal S to output to the sub-output terminal 22a based on the signal of the first control terminal C1. The trigger signal of the set terminal S of the Nth unit circuit 21 is the shifted pulse signal outputted by the output terminal OUT of the (N−1)th unit circuit 21.

The reset module 24 stops outputting the shifted pulse signal from the output terminal OUT of the current unit circuit 21 based on the value of the reset signal of the reset terminal R. The reset signal of the reset terminal R of the Nth unit circuit 21 is the shifted pulse signal outputted by the output terminal OUT of the (N+1)th unit circuit 21. The reset module 24 includes a pull-down transistor T5 connected to the output transistor T2 in series, a first transistor T3 connected between the first node N1 and a low-voltage power source VGL, and a second transistor T4 connected to the first transistor T3 in parallel. A control terminal of the first transistor T3 is electrically coupled to the second control terminal C2, and a control terminal of the second transistor T4 is electrically coupled to the reset terminal R. A control terminal of the pull-down transistor T5 is electrically coupled to the reset terminal R, a source electrode of the pull-down transistor T5 is electrically coupled to the output terminal OUT, and a drain electrode of the pull-down transistor T5 is electrically coupled to the low voltage power source VGL. A second node N2 is defined between the drain electrode of the output transistor T2 and the electrode of the pull-down transistor T5.

Figure 4:
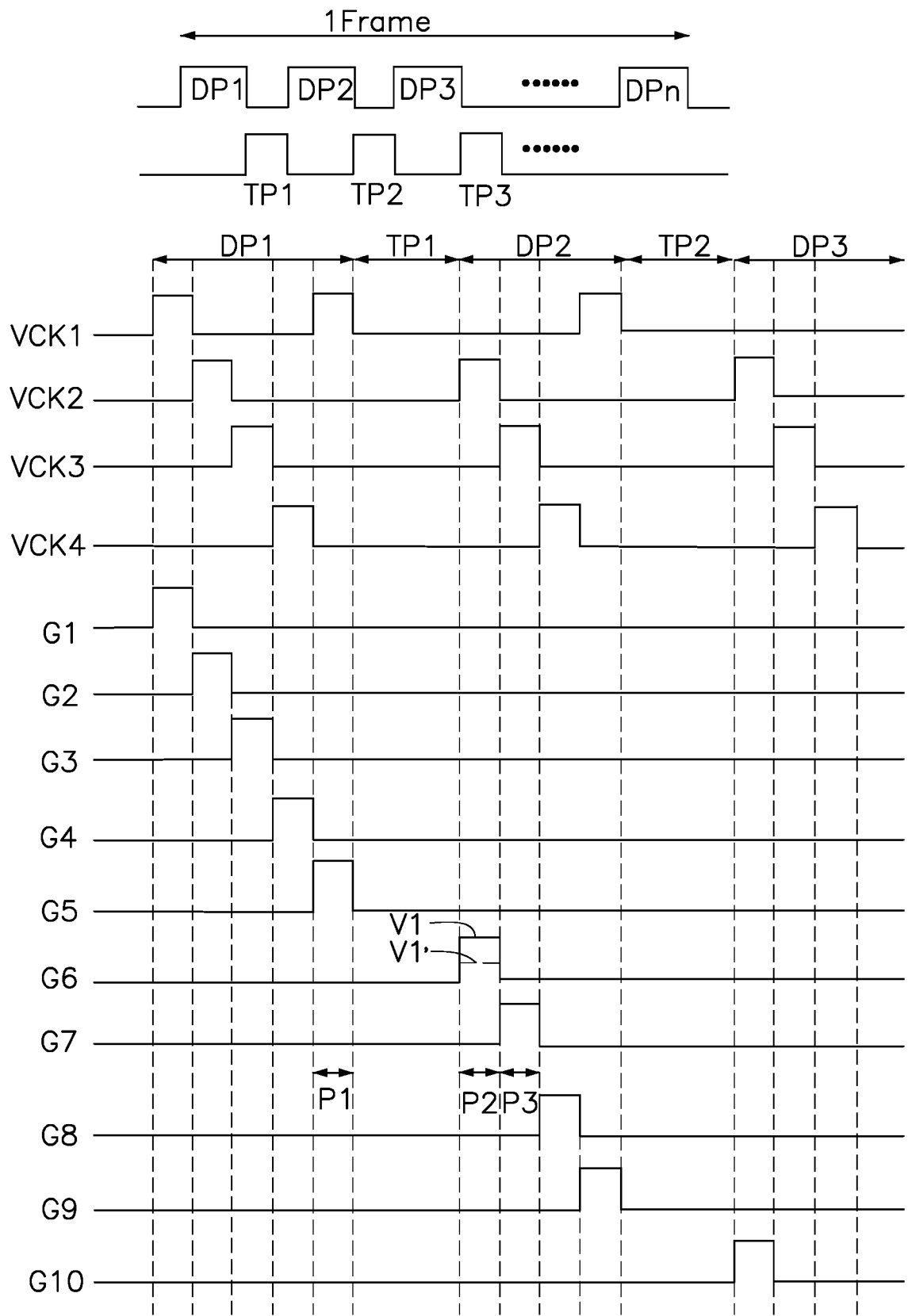
FIG. 4 is a timing chart showing waveforms of the shift register of the touch display apparatus of FIG. 2.

In one embodiment, the shifted pulse signals of the unit circuits 21 are sequentially shifted. A blank period is inserted between the two shifted pulse signals outputted from the two adjacent unit circuits 21. The holding module 25 clamps the shifted pulse signal of one of the two adjacent unit circuits 21 following the other unit circuit 21 to be a high-level voltage. Referring to FIG. 4, the blank period is inserted between the fifth unit circuit 21 and the sixth unit circuit 21. Without the holding module 25, the high-level voltage V1' of the shifted pulse signal of the sixth unit circuit 21 is less than a specified voltage V1, as the broken line shows in the FIG. 4. By comparison with the holding module 25, the high-level voltage of the shifted pulse signal of the sixth unit circuit 21 is maintained at the specified voltage V1.

In one embodiment, the holding module 25 includes a pull-up transistor T6. A control terminal and a drain electrode of the pull-up transistor T6 are electrically coupled to the output terminal OUT, and a source electrode of the pull-up transistor T6 is electrically coupled to a high-voltage power source VDD. The pull-up transistor T6 turns on after the blank period and the output terminal OUT has outputted the shifted pulse signal, and the pull-up transistor T6 clamps the voltage of the output terminal OUT to the specified voltage V1. In one embodiment, the specified voltage is at VDD-Vth. VDD represents the voltage provided by the high voltage power source. Vth represents a threshold voltage of the pull-up transistor T6.

The set terminal S of the first unit circuit 21 and the reset terminal R of the last first unit circuit 21 are electrically coupled to the start pulse signal STV. The set terminal S of the N unit circuit 21 is electrically coupled to the output terminal OUT of the (N−1)th unit circuit 21. The reset terminal R of the N unit circuit 21 is electrically coupled to the output terminal OUT of the (N+1)th unit circuit 21.

In one embodiment, the input transistor T1, the output transistor T2, a first transistor T3, a second transistor T4, a pull-down transistor T5, and a pull-up transistor T6 are all N type thin film transistors.

FIG. 4 shows a timing chart of waveforms of the fifth unit circuit 21. The touch display apparatus 1 operates under a touch period and a display period. In one frame, the touch period includes sub-touch periods TP1-TPn and sub-display periods DP1-DPn. A time sum of the sub-display periods DP1-DPn is equal to a time of each scan line S1-Sn loading the scanning signal. In any of the sub-display periods DP1-DPn, only a part of the scan lines S1-Sn are scanned. Each of the sub-touch periods TP1-TPn is inserted between two adjacent sub-display periods DP1-DPn. During the sub-touch periods TP1-TPn, the entire scan lines S1-Sn stop scanning. In one embodiment, the sub-touch periods TP1-TPn are the blank periods inserted between two adjacent unit circuits 21. During the sub-touch periods TP1-TPn, the signals of the set terminal S, the reset terminal R, the first control terminal C1, the second control terminal C2, and the clock control input terminal CK are at low-level voltage. Each of the sub-display periods DP1-DPn includes a pre-charge period P1, a pull-up period P2, and a pull-down period P3. During the pre-charge period P1, the input module 22 pre-charges the control terminal of the output transistor T2 and the first node N1. During the pull-up period P2, the output module 23 controls the output terminal OUT to output the shifted pulse signal at the high-level voltage synchronous to the signal of the clock control input terminal CK. During the pull-down period P3, the reset module 24 controls the output terminal OUT to be the low-level voltage based on the signal of the reset terminal R.

In one embodiment, the blank period is inserted between the fifth unit circuit 21 and the sixth unit circuit 21, which is equivalent of the first sub-touch period TP1 is inserted between the pre-charge period P1 and the pull-up period P2 of the fifth unit circuit 21. Each sub-touch period TP2-TPn can be inserted between two shifted pulse signals of the two adjacent unit circuits 21. For example, the second sub-touch period TP2 is inserted between the two shifted pulse signals of the ninth unit circuit 21 and the tenth unit circuit 21, which is equivalent of the second sub-touch period TP2 being inserted between the pre-charge period P1 and the pull-up period P2 of the tenth unit circuit 21.

The operation of the sixth unit circuit 21 is described as an example.

The first control terminal C1 is electrically coupled to the clock control line VCK1, the second control terminal C2 is electrically coupled to the clock control line VCK3, and the clock control input terminal CK is electrically coupled to the clock control line VCK2. The set terminal S receives the shifted pulse signal of the fifth unit circuit 21 as the trigger signal, and the reset terminal R receives the shifted pulse signal of the seventh unit circuit 21 as the reset signal.

During the first control terminal C1 and the set terminal S are set to high-level voltage, and the second control terminal C2 and the reset terminal R are set to low-level voltage, the sixth unit circuit 21 is in the pre-charge period P1. The input transistor T1 turns on, and the storage capacitor C and the first node N1 are charged. The output transistor T2 turns on, and controls the signal of the output terminal OUT to be synchronous to the signal of the clock control input terminal CK. When the voltage of the clock input terminal CK is at the low-level voltage, the voltage of the output terminal OUT is also at the low-level voltage.

During the first control terminal C1, the second control terminal C2, the set terminal S, the reset terminal R, and the clock control input terminal CK are set to the low-level voltage, and the sixth unit circuit 21 is in the sub-touch period TP1. The output transistor T2 remains on when the sub-touch period TP1. The voltage of the first node N1 is decreased, and the voltage of the output terminal OUT is at the low-level voltage.

During the first control terminal C1, the second control terminal C2, the set terminal S, and the reset terminal R are set to the low-level voltage, and the clock control input terminal CK is at the high-level voltage, and the sixth unit circuit 21 is in the pull-up period P2. The storage capacitor C discharges so as to keep the output transistor T2 turned on. Without the pull-up transistor T6, the voltage of the output terminal OUT is less than the specified voltage V1 because the voltage of the first node N1 decreases during the sub-touch period TP1. With the pull-up transistor T6, the pull-up transistor T6 turns on, and the voltage of the output terminal OUT is pulled up to the specified voltage V1.

During the first control terminal C1 and the set terminal S are the low-level voltage, and the second control terminal C2 and the reset terminal R are at the high-level voltage, and the sixth unit circuit 21 is in the pull-down period P3. The first transistor T3 and the fourth transistor T4 turn on, when the voltage of the first node N1 is pulled down to the low-level voltage. The pull-down transistor T5 turns on when the voltage of the output terminal OUT is pulled down to the low-level voltage.

Based on this structure of the touch display apparatus 1, when a blank period is inserted between two adjacent shifted pulse signals outputted by two adjacent unit circuits, the holding module 25 clamps the output terminal OUT of the following unit circuit of the two adjacent unit circuits to the specified voltage, thus voltage drop of the output terminal OUT is avoided, and the performance of the touch display apparatus 1 is improved.

While various and preferred embodiments have been described the disclosure is not limited thereto. On the contrary, various modifications and similar arrangements (as would be apparent to those skilled in the art) are also intended to be covered. Therefore, the scope of the appended claims should be accorded the broadest interpretation so as to encompass all such modifications and similar arrangements.

What is claimed is:

1. A shift register for generating a plurality of shifted pulse signals shifted by a specified phase, the shift register comprising:
    a plurality of cascade-connected unit circuits, each unit circuit configured to receive a clock control signal, and each unit circuit comprising:
    an output terminal, electrically coupled to at least one external signal line, and configured to provide a shifted pulse signal to the connected at least one external signal line;
    an input transistor, controlled by a first control signal, and configured to output a high-level voltage to a first node based on a trigger signal for activating the unit circuit;
    an output transistor, including a first control terminal connected to the first node, a first connection terminal receiving the clock control signal, and a second connection terminal connected to the output terminal, the output transistor outputting the shifted pulse signal to the output terminal in response to the high-level voltage of the first node, the shifted pulse signal being synchronous with the clock control signal;
    a storage capacitor, the two opposite terminals of which are connected with the first node and the output terminal; and
    a pull-up transistor, including a second control terminal connected to the output terminal, a third connection terminal connected to the second control terminal, and a fourth connection terminal connected to a high voltage power source;
    wherein the shifted pulse signal of the (N+1)th unit circuit outputted to the (N+1)th signal line is shifted by a specified phase by compared to the shifted pulse signal of the Nth unit circuit outputted to the Nth signal line; a blank period is inserted between two adjacent shifted pulse signals of two adjacent unit circuits; during the (N+1)th unit circuit outputting the shifted pulse signal after the blank period is inserted between the Nth unit circuit and the (N+1)th unit circuit, the pull-up transistor clamps the voltage of the output terminal of the (N+1)th unit circuit at a high-level voltage;
    wherein the unit circuit further comprises a reset module to receive a reset signal; the reset module comprises a pull-down transistor; the pull-down transistor comprises a third control terminal for receiving the reset signal, a fifth connection terminal connected with the output terminal, and a sixth connection terminal connected to a low voltage power source; the pull-down transistor outputs a low-level voltage to the output terminal based on the reset signal, which causes the current unit circuit to reset;
    wherein the reset module further receives a second control signal; the reset module further comprises a first transistor; the first transistor comprises a fourth control terminal for receiving the second control signal, a seventh connection terminal connected with the first node, and an eighth connection terminal connected to the low voltage power source; the first transistor outputs the low-level voltage to the first node based on the second control signal.

2. The shift register of claim 1, wherein during the blank period, each unit circuit stops outputting the shifted pulse signal.

3. The shift register of claim 1, wherein each of the clock control signal, the first control signal, and the second control signal originate from three adjacent clock lines respectively, and the signals of the first control signal, the clock control signal, and the second control signal are sequentially shifted by the specified phase shift.

4. The shift register of claim 1, wherein the reset module further comprises a second transistor; the second transistor comprises a fifth control terminal for receiving the reset signal, a ninth terminal connected with the first node, and a tenth connection terminal connected to the low voltage power source; the second transistor output the low-level voltage to the first node based on the reset signal.

5. A touch display apparatus comprising:
a display region; and
a non-display region surrounding the display region, and the non-display region comprising:
at least one gate driver with at least one shift register disposed in the non-display region; the shift register comprising a plurality of cascade-connected unit circuits, and configured to generate a plurality of shifted pulse signals shifted by a specified phase shift; each unit circuit configured to receive an clock control signal, each of the unit circuit comprising:
an output terminal, electrically coupled to at least one external signal line, and configured to provide a shifted pulse signal to the connected at least one external signal line;
an input transistor, controlled by a first control signal, and configured to output a high-level voltage to a first node based on a trigger signal activating the unit circuit;
an output transistor, including a first control terminal connected to the first node, a first connection terminal receiving the clock control signal, and a second connection terminal connected to the output terminal, the output transistor outputting the shifted pulse signal to the output terminal in response to the high-level voltage of the first node, the shifted pulse signal being synchronous with the clock control signal;
a storage capacitor, the two opposite terminals of which are connected with the first node and the output terminal; and
a pull-up transistor, including a second control terminal connected to the output terminal, a third connection terminal connected to the second control terminal, and a fourth connection terminal connected to a high voltage power source;

wherein the shifted pulse signal of the (N+1)th unit circuit outputted to the (N+1)th signal line is shifted a specified phase by compared to the shifted pulse signal of the Nth unit circuit outputted to the Nth signal line; a blank period is inserted between two adjacent shifted pulse signals of two adjacent unit circuits; during the (N+1)th unit circuit outputting the shifted pulse signal after the blank period is inserted between the Nth unit circuit and the (N+1)th unit circuit, the pull-up transistor clamps the voltage of the output terminal of the (N+1)th unit circuit at a high-level voltage;

wherein the unit circuit further comprises a reset module to receive a reset signal; the reset module comprises a pull-down transistor; the pull-down transistor comprises a third control terminal for receiving the reset signal, a fifth connection terminal connected with the output terminal, and a sixth connection terminal connected to a low voltage power source; the pull-down transistor outputs a low-level voltage to the output terminal based on the reset signal, which causes the current unit circuit to reset;

wherein the reset module further receives a second control signal; the reset module further comprises a first transistor; the first transistor comprises a fourth control terminal for receiving the second control signal, a seventh connection terminal connected with the first node, and an eighth connection terminal connected to the low voltage power source; the first transistor outputs the low-level voltage to the first node based on the second control signal.

6. The touch display apparatus of claim 5, wherein during the blank period, the entire unit circuits stops outputting the shifted pulse signal.

7. The touch display apparatus of claim 5, wherein the clock control signal, the first control signal, and the second control signal originate from three adjacent clock lines respectively, and the signal of the first control signal, the clock control signal, and the second control signal are sequentially shifted by the specified phase shift.

8. The touch display apparatus of claim 5, wherein the reset module further comprises a second transistor; the second transistor comprises a fifth control terminal received the reset signal, a ninth connection terminal connected with the first node, and a tenth connection terminal connected to the low voltage power source; the second transistor outputs the low-level voltage to the first node based on the value of the reset signal.

9. The touch display apparatus of claim 5, wherein the touch display apparatus selectively operated under a touch period and a display period, the display period comprises a plurality of sub-display period; the touch period comprises a plurality of sub-touch periods, each sub-touch period is inserted between two adjacent sub-display periods; the blank period is the sub-touch period.

* * * * *